US012681435B2

(12) United States Patent
Hunziker

(10) Patent No.: US 12,681,435 B2
(45) Date of Patent: Jul. 14, 2026

(54) PROCESS FOR PRODUCING A THERMO-COMPENSATED OSCILLATOR

(71) Applicant: ROLEX SA, Geneva (CH)

(72) Inventor: Olivier Hunziker, Vevey (CH)

(73) Assignee: ROLEX SA, Geneva (CH)

( * ) Notice: Subject to any disclaimer, the term of this patent is extended or adjusted under 35 U.S.C. 154(b) by 750 days.

(21) Appl. No.: 16/282,560

(22) Filed: Feb. 22, 2019

(65) Prior Publication Data

US 2019/0271946 A1     Sep. 5, 2019

(30) Foreign Application Priority Data

Mar. 1, 2018     (EP) ..................................... 18159522

(51) Int. Cl.
| | |
|---|---|
| *G04B 17/04* | (2006.01) |
| *B81B 3/00* | (2006.01) |
| *G04B 17/06* | (2006.01) |
| *G04B 17/22* | (2006.01) |

(52) U.S. Cl.
CPC .......... *G04B 17/045* (2013.01); *B81B 3/0081* (2013.01); *G04B 17/066* (2013.01); *G04B 17/227* (2013.01)

(58) Field of Classification Search
CPC .. G04B 17/045; G04B 17/066; G04B 17/227; B81B 3/0081
USPC ........................................................ 368/125
See application file for complete search history.

(56) References Cited

U.S. PATENT DOCUMENTS

| | | | | | |
|---|---|---|---|---|---|
| 8,147,127 | B2 * | 4/2012 | Silva | ........................ | G04D 7/10 |
| | | | | | 368/170 |
| 2002/0180130 | A1 * | 12/2002 | Baur | ....................... | C22C 27/02 |
| | | | | | 267/156 |

| | | | | | |
|---|---|---|---|---|---|
| 2009/0236782 | A1 * | 9/2009 | Buhler | ................. | G04D 3/0041 |
| | | | | | 29/896.9 |
| 2010/0002548 | A1 * | 1/2010 | Hessler | .................. | G04B 17/20 |
| | | | | | 368/129 |
| 2017/0108831 | A1 * | 4/2017 | Bossart | ................ | G04B 17/063 |

(Continued)

FOREIGN PATENT DOCUMENTS

| | | | | | |
|---|---|---|---|---|---|
| CH | 704149 | A2 * | 5/2012 | ............... | G04D 7/10 |
| CH | 705 127 | A2 | 12/2012 | | |
| CH | 705127 | B1 * | 11/2015 | ........... | G04B 17/066 |

(Continued)

OTHER PUBLICATIONS patents.google.com/patent/EP1837722B1/en?oq=EP+1837722+ Oct. 12, 2023 (Year: 2023).*

(Continued)

*Primary Examiner* — Edwin A. Leon
*Assistant Examiner* — Kevin Andrew Johnston
(74) *Attorney, Agent, or Firm* — WHDA, LLP

(57) ABSTRACT

A process for manufacturing a timepiece oscillator made up of a balance and of at least two spring portions that are arranged in parallel, which includes (a) choosing the frequency f of the oscillator, (b) choosing a balance and spring portions so that the inertia of the balance and the angular stiffnesses of the spring portions allow an oscillator of chosen frequency f to be formed and so that the variations in angular stiffness of the spring portions as a function of temperature are able to thermo-compensate the oscillator, and (c) assembling the chosen spring portions with the chosen balance.

20 Claims, 1 Drawing Sheet

(56) References Cited

U.S. PATENT DOCUMENTS

2018/0364645 A1* 12/2018 Fraessdorf ............. G04B 29/02

FOREIGN PATENT DOCUMENTS

EP          1837722 A2 *  9/2007  .............. B81B 7/00
EP          2 063 325 A2    5/2009
EP          3 088 969 A1    11/2016

OTHER PUBLICATIONS

CH 704149 A2 Machine Translation from PE2E Search (Year: 2012).*
CH 705127 B1 Machine Translation from PE2E Search (Year: 2015).*
European Search Report and Written Opinion dated Aug. 30, 2018 issued in counterpart application No. EP18159522; w/ English machine translation (17 pages).

* cited by examiner

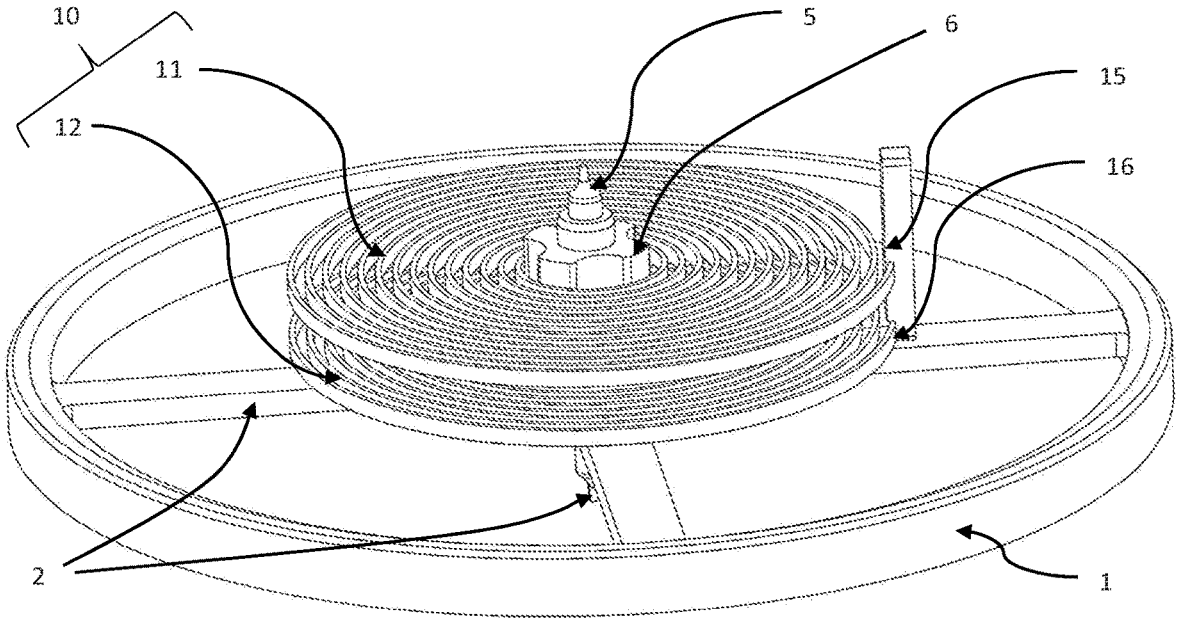

PROCESS FOR PRODUCING A
THERMO-COMPENSATED OSCILLATOR

This application claims priority of European patent application No EP18159522.4 filed Mar. 1, 2018, which is hereby incorporated by reference herein in its entirety.

BACKGROUND ART

The invention relates to a timepiece oscillator, and to a timepiece movement and a timepiece as such, that comprise an oscillator. Lastly, it also relates to a process for manufacturing such an oscillator.

The regulation of mechanical watches relies on at least one mechanical oscillator, which generally comprises a flywheel, called a balance, and a spiral-shaped wound spring, called a spiral spring or more simply just a spiral. The spiral may be fastened at one end to the arbor of the balance and at the other end to a fixed portion of the timepiece, such as a bridge, on which the arbor of the balance pivots. The spiral spring with which the movements of mechanical watches of the prior art are equipped takes the form of an elastic metal blade or of a blade made of silicon preferably of rectangular cross section, most of which is wound on itself in a spiral. The sprung balance oscillates about its equilibrium position (or dead point). When the balance leaves this position, it arms the spiral. This creates a return torque that acts on the balance in order to tend to make it return to its equilibrium position. As it has acquired a certain speed, and therefore a certain kinetic energy, the balance moves beyond its dead point until a counteracting torque of the spiral stops it and obliges it to turn in the other direction. In this way, the spiral regulates the oscillation period of the balance.

The precision of a mechanical watch depends on the regularity of the oscillations of its oscillator, formed by the balance and the spiral. The frequency of these oscillations is set by the inertia of the balance and the stiffness of the spiral, and there are several ways of achieving a given frequency with precision, for example by means of adjusting elements that influence the stiffness of the spring, or by suitable pairing of one particular balance with a given spiral. Such pairing also allows the required adjustment to be limited.

However, when the temperature varies, the respective thermal expansions of the spiral and of the balance modify the properties of this oscillator, thus disturbing the precision of the watch.

There are prior-art solutions that attempt to decrease, or even prevent, functional variations in an oscillator with temperature. One approach considers the natural frequency f of such an oscillator to depend on the ratio between the return torque C, which corresponds to the angular stiffness of the spiral, and which is exerted by the spiral on the balance, and the moment of inertia I of the latter, according to the following relationship:

$$f = \frac{1}{2\pi}\sqrt{\frac{C}{I}}$$

By differentiating the preceding equation with respect to temperature, the relative thermal variation in the natural frequency of the oscillator is obtained, which is expressed by:

$$\frac{1}{f}\frac{df}{dT} = \frac{1}{2}\left[\frac{1}{E}\frac{dE}{dT} + 3\alpha_s - 2\alpha_b\right]$$

where E is the Young's modulus of the spiral of the oscillator, $$\frac{1}{f}\frac{df}{dT}$$

is the thermal coefficient of the oscillator, also simply denoted by the acronym CT, $$\frac{1}{E}\frac{dE}{dT}$$

is the thermal coefficient of the Young's modulus of the spiral of the oscillator, also referred to by the acronym CTE, and $\alpha_s$ and $\alpha_b$ are the thermal expansion coefficients of the spiral and of the balance of the oscillator, respectively.

Various prior-art solutions seek to make the value of the thermal coefficient CT of the oscillator zero by choosing for the spiral a CTE that is suitable for this purpose, in order to thermo-compensate the oscillator.

SUMMARY OF THE INVENTION

The aim of the invention is to provide a timepiece oscillator obtained using a method for combining the components thereof that allows not only the thermo-compensation of the oscillator to be guaranteed but also the pairing of the balance and its angular return spring to be improved, in order to reliably achieve a given oscillation frequency.

To this end, the invention is based on the association of an angular return spring, comprising an arrangement of at least two distinct portions which variations in angular stiffness are different depending on the temperature, with a balance, which inertia may be known, to form a timepiece oscillator, so that said timepiece oscillator may be thermo-compensated while oscillating at a given frequency without requiring any adjustment, or at the very least while minimizing the necessary adjustment operations.

Thus, the invention relates to a process for manufacturing a timepiece oscillator made up of a balance and of at least two spring portions that are arranged in parallel, wherein it comprises the following steps:

optionally choosing the materials of the balance and of the spring portions beforehand;

a. choosing the frequency f of the oscillator; then b. choosing a balance and spring portions so that the inertia of the balance and the angular stiffnesses of the spring portions allow an oscillator of chosen frequency f to be formed and so that the variations in angular stiffness of the spring portions as a function of temperature are able to thermo-compensate the oscillator;

c. assembling said chosen spring portions with the chosen balance.

The step (b) of choosing the spring portions comprises or consists in selecting the most appropriate spring portions among at least two batches or at least two sets of existing spring portions According to one embodiment, the process comprises the following steps:

choosing the materials of the balance and of said portions
of the spiral spring, said portions possibly being made
of different materials;
choosing the frequency f of the oscillator;
measuring or assessing the inertia I of the balance;
calculating angular stiffnesses Ci for each portion i of the
spring such that $$f = \frac{1}{2\pi}\sqrt{\frac{\sum_i C_i}{I}}$$

and that the following equation equals zero $$\frac{1}{f}\frac{df}{dT} = \frac{1}{2}\left(\frac{\sum_i C_i(CTE_i + 3\alpha_{s,i})}{\sum_i C_i} - 2\alpha_{bal}\right);$$

choosing spring portions i which respective angular stiff-
nesses are close to the calculated values Ci
assembling said at least two chosen portions of the spring
with the balance.
The invention also relates to the timepiece oscillator
obtained using this process and a timepiece as such.
The invention is more precisely defined by the claims.

BRIEF DESCRIPTION OF THE DRAWINGS

The subjects, features and advantages of the present
invention will be described in more detail in the following
description of particular nonlimiting embodiments, which is
given with reference to the appended FIGURE:
FIG. 1 schematically shows a timepiece oscillator includ-
ing an angular return spring of spiral-spring type, with a
parallel arrangement of two spiral portions according to one
embodiment of the invention.

DETAILED DESCRIPTION OF PARTICULAR EMBODIMENTS

The objective of the invention is to propose a thermo-
compensated oscillator that does not require or that requires
very little adjustment. To this end, a solution that achieves
a value for the thermal coefficient (CT) of the oscillator that
is as close as possible to zero, the oscillations of said
oscillator thus being made independent or almost indepen-
dent of the temperature, and a combination of a flywheel that
will be called a "balance" and a return spring that guarantees
the required frequency, which is chosen beforehand and
therefore set, are sought.
The embodiment of the invention that will be described is
based on a construction of an oscillator obtained by asso-
ciating at least two distinct angular-return-spring portions
that are chosen to form an angular return spring that may be
coupled to a predefined balance and more specifically to a
balance which inertia will have been measured, in order to
obtain a thermo-compensated oscillator, so as to guarantee
the chosen natural frequency of the oscillator whatever the
temperature.
The invention will be illustrated in more detail with one
embodiment, which is shown in FIG. 1, in which a timepiece
oscillator takes the form of a balance-spring assembly. The
angular return spring 10 of the oscillator takes the form of
a "bi-spiral", comprising a parallel arrangement of two spirals 11, 12. The expression "parallel" will be understood
to mean an attachment of each of the two spirals on the one
hand to the arbor 5 of the balance, for example by means of
one or two collets 6, and, on the other hand, to the balance
bridge, for example by means of one or two studs connected
to their respective peripheral ends 15, 16. This angular return
spring acts on a flywheel or balance 1, which is connected
to the arbor 5 by arms 2. These components together form
a mechanical oscillator.
In this embodiment, each distinct portion of the angular
return spring is formed from a spiral or from a spiral
segment, comprising one or more turns or turn segments.
The term "turn" defines a segment of the spiral extending
over an angular arc of about 360°, and the expression "turn
segment" defines a segment extending over an angular arc
smaller than 360°. In addition, each spiral, turn or turn
segment of these embodiments of the invention takes the
form of an elastic blade, preferably of rectangular cross
section, that is wound about itself into a spiral. e will denote
the thickness and h the height of this rectangular cross
section. In addition, L will denote the curvilinear length of
a spiral, turn or turn segment. This curvilinear length is
defined as the separation between two curvilinear abscissae,
on the neutral fiber of the turn. Lastly, r will denote the
radius of gyration of the balance and m its mass.
A set of spirals consists of spirals, turns or turn segments
made of the same material. A batch of spirals, turns or turn
segments is a set of spirals, turns or turn segments that may
be considered to be identical to within geometric manufac-
turing tolerances.
Here the term "material" is used to mean either a single
uniform material, or a composite material resulting from a
combination of materials in a given arrangement. By way of
nonlimiting example, a spiral made of single-crystal silicon
coated on all its faces with silicon oxide of a given thickness
is considered to be a composite material.
In the case of two spirals (or turns or turn segments)
arranged in parallel, the contribution of a spiral to the
thermo-compensation is weighted by its relative contribu-
tion to the return torque, and therefore to the angular
stiffness.
The return torque of the return spring is the sum of the
torques of the two spirals. The natural frequency f of the
oscillator may then be written by the following equation:

$$f = \frac{1}{2\pi}\sqrt{\frac{C_1 + C_2}{I}} \tag{1}$$

where I is the inertia of the balance and Ci the angular
stiffness of a spiral i. In the general case, equation (1)
becomes:

$$f = \frac{1}{2\pi}\sqrt{\frac{\sum_i C_i}{I}}.$$

The inertia I and the angular stiffness Ci, which is defined
for pure flexion, are calculated as follows:

$$I = mr^2 \text{ and } C_i = \frac{E_i e_i^3 h_i}{12\, l_i}$$

where m is the mass of the balance, r the radius of gyration of the balance, Ei the elastic modulus of the material of the spiral i, ei the thickness of the blade of the spiral i, hi the height of the blade of the spiral i, and li the curvilinear length of the spiral i.

By introducing temperature-dependent terms I and Ci and differentiating equation (1) with respect to the temperature, the following equation is obtained after rearrangement:

$$\frac{1}{f}\frac{df}{dT} = \frac{1}{2}\left(\frac{1}{\sum_i C_i}\sum_i \frac{dC_i}{dT} - \frac{2}{r}\frac{dr}{dT}\right) \quad (2)$$

For the case of a spiral, equation (2) becomes:

$$\frac{1}{f}\frac{df}{dT} = \frac{1}{2}\left(\frac{1}{\sum_i C_i}\sum_i C_i\left(\frac{1}{E_i}\frac{dE_i}{dT} + \frac{3}{e_i}\frac{de_i}{dT} + \frac{1}{h_i}\frac{dh_i}{dT} - \frac{1}{l_i}\frac{dl_i}{dT}\right) - \frac{2}{r}\frac{dr}{dT}\right)$$

If uniform and isotropic materials are considered, or if for each material a suitable apparent expansion coefficient is used, the thermal expansion coefficient of the materials $\alpha = 1/x \cdot dx/dT$ is identical for the directions x defined above (r, L, e and h). Furthermore, if the term CTE is defined to be the thermal coefficient of the elastic modulus $1/E \cdot dE/dT$, the preceding equation may be simplified as follows:

$$\frac{1}{f}\frac{df}{dT} = \frac{1}{2}\left(\frac{\sum_i C_i(CTE_i + 3\alpha_{s,i})}{\sum_i C_i} - 2\alpha_{bal}\right) \quad (2')$$

where $\alpha_{s,i}$ and $\alpha_{bal}$ are the thermal expansion coefficients of the spiral i and of the balance of the oscillator, respectively.

As this first embodiment comprises two spirals (i=2), the preceding equation becomes:

$$\frac{1}{f}\frac{df}{dT} = \frac{1}{2}\left(\frac{C_1}{C_1 + C_2}(CTE_1 + 3\alpha_{s,i}) + \frac{C_2}{C_1 + C_2}(CTE_2 + 3\alpha_{s,i}) - 2\alpha_{bal}\right) \quad (3)$$

Once the material of the balance has been defined, the value of $\alpha_{bal}$ is known and the results satisfying equation (3) may be represented by a straight line in the plane $[C_1:C_2]$. There are thus a multitude of pairs of solutions $C_1$, $C_2$ that will satisfy this equation. Those skilled in the art will be able to choose the materials of the balance and that or those of the spirals (or turns or turn segments) in a suitable way to allow solutions to this equation to be found.

If the inertia of the balance is known, it will then be possible, in a given plane, to draw, using equation (1), another straight line corresponding to the solutions of equation (1) when it is set equal to zero. Simply choosing spirals portions with angular stiffnesses C1 and C2 corresponding to the intersection of these two straight lines, and assembling these two portions to form the spiral, which may then be assembled with the balance to form the oscillator, will guarantee production of a thermo-compensated oscillator that will oscillate with the required frequency.

It will be noted that in the case of an anisotropic material, silicon for example, the thermal coefficient varies depending on the crystal direction of the stress on the material and therefore varies over the length of the spiral (or of the turn or turn segment). Likewise, in the case of a nonuniform material, such as oxidized silicon, the thermal coefficient varies in the interior of the cross section of the blade. An equivalent or apparent CTE, known to those skilled in the art, may thus be considered for a spiral, or a turn or a turn segment, formed from an anisotropic and/or nonuniform material.

For example, if the balance is made of CuBe2, as the thermal expansion of CuBe2 is positive (+17 ppm/° C.), it is necessary to choose the materials of the two spirals so that at least one of the two terms CTE+$\alpha_s$ is positive in order to make the equation equal zero, and in particular so that at least one of the two terms CTE+$\alpha_s$ is higher then at least two times $\alpha_{bal}$ in order to make the equation equal zero. Simply adjusting the dimensions of the two spirals, in particular their angular stiffness, will allow to obtain the desired result, namely a thermo-compensation of the oscillator.

By way of example, for an oscillator that oscillates at 4 Hz, a balance made of CuBe2 of a measured inertia of 14.28 mg·cm$^2$ will first be considered. Next, a batch of spirals S1 made of single-crystal silicon, cleaved in a {100} plane, and having the following properties and dimensions will be considered: Emean=148 GPa, $\alpha$=2.6 ppm/° C., CTE=−64.3 ppm/° C., height of 150 microns, active length of 150 mm and which thickness is close to 36.5 μm. In addition, a second batch S2 of spirals made of amorphous SiO$_2$, having the following properties and dimensions will be considered: E=72.4 GPa, $\alpha$=0.382 ppm/° C., CTE=210 ppm/° C., and of the same dimensions as the spirals of the first batch, which will be assembled in parallel on the balance to produce the oscillator.

The frequency of 4 Hz will be obtained by choosing among the two batches of spirals a first spiral S1a which angular stiffness C1 is 5.97×10$^{-7}$ Nm (corresponding to a thickness of 36.445 μm), and a second spiral S2a which angular stiffness C2 is 3.05×10$^{-7}$ Nm (corresponding to a thickness of 36.975 μm). These two spirals will be assembled to form a spiral, which will in its turn be assembled with the balance to form a thermo-compensated oscillator that oscillates at the frequency of 4 Hz.

For a composite material such as defined above, the CTE is therefore calculated from the CTEs of each of the materials used, and weighted by the geometric arrangement of the various materials, in a way known to those skilled in the art.

The thermal coefficient of the oscillator, which is given by equation (3), allows, after rearrangement, the target value of CTE$_2$+3$\alpha_2$ to be defined as follows:

$$CTE_2 + 3\alpha_{s2} = \frac{2\alpha_{bal}(2\pi f)^2 I - C_1(CTE_1 + 3\alpha_{s1})}{(2\pi f)^2 I - C_1}$$

Thus, if for a spiral its stiffness and its stiffness variation as a function of temperature (CTE+3$\alpha$) are known, it becomes possible to choose a second spiral allowing the CT to be made equal to zero. These two spirals will then be able to be paired with a balance of suitable inertia to achieve the target frequency.

By way of an example made of composite materials, for an oscillator oscillating at 4 Hz consisting of a balance made of CuBe2 of an measured inertia of 14.12 mg·cm$^2$, a batch of spirals Si made of single-crystal silicon will be considered which are cleaved in the {100} plane, and coated on all their faces with a layer of amorphous silicon oxide of 3.5 μm thickness so as to form a composite spiral having a height of 157 microns and an active length of 150 mm and the thickness of which is close to 39 μm. The angular stiffness of the spirals is measured individually and all of the spirals are located in a range close to $4.5 \times 10^{-7}$ Nm. The CTE of these composite spirals may be calculated from the CTE values of silicon and of amorphous oxidized silicon and from the geometry of the spiral (respective thicknesses of silicon and oxide).

The frequency of 4 Hz will be obtained by choosing among this batch of composite spirals a first spiral which angular stiffness C1 is $4.8665 \times 10^{-7}$ Nm and a second spiral which angular stiffness C2 is $4.0533 \times 10^{-7}$ Nm. These two spirals will be assembled to form a spiral, which will in its turn be assembled with the balance to form a thermo-compensated oscillator that oscillates at the frequency of 4 Hz.

In summary, this embodiment of the invention is based on a process for manufacturing a timepiece oscillator made up of a balance and of at least two return-spring portions i that are arranged in parallel, wherein it comprises the following steps:

choosing the materials of the balance and of said portions of the spiral spring, said portions possibly being made of different materials;

choosing the frequency f of the oscillator;

measuring, estimating or assessing the inertia I of the balance;

calculating angular stiffnesses Ci for each portion i of the spring such that $$f = \frac{1}{2\pi} \sqrt{\frac{\sum_i C_i}{I}}$$

and that, in the case of a spiral spring, the following equation also equals zero:

$$\frac{1}{f}\frac{df}{dT} = \frac{1}{2}\left( \frac{\sum_i C_i(CTE_i + 3\alpha_{s,i})}{\sum_i C_i} - 2\alpha_{bal} \right);$$

choosing spring portions i made from the various chosen materials and which respective angular stiffnesses are close to the calculated values Ci;

assembling said at least two chosen portions of the spring with the balance.

There is naturally a multitude of possibilities of arrangement in parallel of two spirals and a balance, which dimensions are different, so as to make equation (2') above equal zero and to obtain a thermo-compensated oscillator that oscillates at the desired frequency.

One variant of this first embodiment is based on an angular return spring of an oscillator formed by the arrangement in parallel of three spirals taken from at least two batches of spirals and forming three distinct portions of said return spring. This variant allows the number of combinations of spiral portions to be increased so as to be able to make it completely unnecessary to adjust the oscillator and/or to make it possible to combine spiral portions which properties and/or dimensions are very different, but also to achieve second-order thermo-compensation, which is useful in the case of the use of materials which variations in thermal coefficient as a function of temperature also have opposite signs.

Thus, the invention has the advantage of allowing a high-performance timepiece oscillator to be manufactured, by increasing the flexibility of pairing of the balance and spiral so as to achieve with precision a given oscillation frequency, allowing subsequent adjustments to be limited, or even avoided altogether, while forming an oscillator that preserves its given oscillation frequency despite temperature changes.

Naturally, the invention is not limited to the embodiments described above, nor to the examples detailed, nor indeed to the simple equations mentioned above. It may in particular include more than three distinct return spring portions.

Furthermore, the distinct portions of the return spring may or may not be located in the same plane. A blade of at least one distinct portion of the return spring, for example taking the form of turns or turn segments, may have a cross section of any shape, and not necessarily of rectangular shape as in the preceding embodiments. In addition, this cross section may remain constant over all its length, or in contrast vary. Lastly, the distinct portions of the return spring may take the form of a spiral, as envisaged in the preceding examples, or as a variant take any other form, in particular the form of a rectilinear blade.

Lastly, what is meant by distinct portions of the return spring is two or more distinct elements that are positioned in a given arrangement to form together the return spring. In this arrangement, these distinct portions thus participate in a complementary way in the same return spring function, while endowing a thermo-compensation effect on the oscillator. They are chosen so as to combine this thermo-compensation effect with the precise choice of the frequency of the oscillator. These distinct portions may be assembled to each other by any fastening means, or simply positioned in proximity. In any case, these distinct portions are arranged so as to be able to interact with a given flywheel, and to form a single timepiece oscillator. These distinct portions are therefore not simply two zones of a given spring that is integrally formed, indissociable and/or monolithic, even if these two zones may contain different materials.

Thus, it is possible to combine at least two spirals to produce a thermo-compensated oscillator, and it also becomes possible to combine said two spirals with one particular balance to adjust the frequency of the oscillator.

The balance is for example made of a copper-beryllium alloy, in a known way (also simply called CuBe2 alloy), as it was illustrated in the preceding embodiments. As a variant, other materials may be used for the balance.

Advantageously, at least two distinct portions of the angular return spring are made of two different materials. A distinct portion may be integrally formed. It may be made of a single material, or comprise a plurality of different materials, and for example comprise zones made of different materials.

In any case, the return spring of the invention comprises at least two distinct portions which variations in angular stiffness Ci as a function of temperature, i.e. expressed by the term CTE+3αs, will compensate the thermal expansion of the associated balance, so that said oscillator comprising this timepiece return spring is thermo-compensated.

Naturally, a distinct portion of the return spring may be made in any other material. Preferably, a material insensitive to magnetic fields is preferred, in order to avoid disruptions to the movement related to residual magnetization of components subjected to a magnetic field.

At least all or some of one distinct portion of the return spring may comprise single-crystal silicon whatever its orientation, polysilicon, amorphous silicon, quartz, amorphous silicon oxide, doped silicon whatever the dopant type and concentration, porous silicon, an alloy based on Fe—Ni which thermal coefficient of the Young's modulus (CTE below) is positive, and/or an Nb—Zr—O alloy.

At least one distinct portion of the return spring may comprise one or more isotropic materials. As a variant, it may comprise an anisotropic material, for example silicon, which thermal coefficient varies depending on the crystal direction of the stress on the material and therefore varies over the length of the spiral. The silicon may, for example, be coated with a layer of silicon oxide. In the case of a nonuniform material such as oxidized silicon, the thermal coefficient varies in the interior of the cross section of the blade of the return spring. The terms dC/dT or equivalent or apparent CTE, which are known to those skilled in the art, are thus considered for a distinct return-spring portion formed from an anisotropic and/or nonuniform material, and the preceding calculations remain applicable on this basis.

The embodiment described above defines various steps that are executed in the order such as described. However, the invention may as a variant be implemented using different approaches, in particular consisting in inverting the order of certain of the described steps.

In particular, the described process comprises choosing beforehand a balance, which inertia I is then measured or estimated, or in contrast constructing or choosing a balance which inertia I was chosen beforehand, before choosing spring portions to construct a return spring suitable for the chosen balance.

As a variant, the return spring or at least one portion of the return spring could be chosen first, before subsequently choosing the suitable balance.

In addition, the materials of the balance and the spring portions are likewise advantageously chosen beforehand, among materials that possess natural properties known to those skilled in the art such as to guarantee the success of the implementation of the following steps. However, as a variant, the material may be chosen a posteriori or simultaneously to the choice of other parameters, such as the geometry, of the balance and/or of the spring portions.

Thus, many other embodiments may be defined, based on a process for manufacturing a timepiece oscillator made up of a balance and of at least two spring portions that are arranged in parallel, comprising the following steps:

a choosing the frequency f of the oscillator;

b. choosing a balance and spring portions so that the inertia of the balance and the angular stiffnesses of the spring portions allow an oscillator of chosen frequency f to be formed and so that the variations in angular stiffness of the spring portions as a function of temperature are able to thermo-compensate the oscillator;

c. assembling said chosen spring portions with the chosen balance.

The process advantageously comprises a prior step consisting in choosing the materials of the balance and of the spring portions.

The choosing step (b), advantageously comprises choosing a balance of inertia I and spring portions of angular stiffnesses $C_i$ that respect the following equations:

$$f = \frac{1}{2\pi}\sqrt{\frac{\sum_i C_i}{I}}$$

and

-continued $$\frac{1}{f}\frac{df}{dT} = \frac{1}{2}\left(\frac{\sum_i C_i(CTE_i + 3\alpha_{s,i})}{\sum_i C_i} - 2\alpha_{bal}\right) = 0$$

Thus, the invention has the advantage of allowing a high-performance timepiece oscillator to be manufactured by increasing the flexibility of pairing of the balance and of the spiral so as to achieve with precision a given oscillation frequency. This flexibility is increased by the ability to choose the balance and/or the spring portions among existing batches, in any order and/or in any possible combination of orders, without requiring specific manufacturing for each new timepiece arrangement. It is naturally possible as a variant to implement the invention by specifically manufacturing a balance and/or all or some of the spring portions depending on the sought-after properties defined by the invention.

The invention also relates to a timepiece movement and to a timepiece, such as a watch, a wristwatch for example, comprising an oscillator such as described above.

The invention claimed is:

1. A process for manufacturing a timepiece oscillator comprising a balance and at least two spring portions that are arranged in parallel, wherein the process consists of the following performed in the order provided:

a. choosing the frequency f of the oscillator;

b. choosing the balance and the at least two spring portions, by selecting the most appropriate distinct spring portions among at least two batches or at least two sets of existing spring portions, so that the inertia of the balance and the angular stiffnesses of the spring portions allow an oscillator of chosen frequency f to be formed and so that the variations in angular stiffness of the spring portions as a function of temperature are able to thermo-compensate the oscillator; and c. assembling said chosen at least two spring portions to form a spring, which is in its turn assembled with the chosen balance, said spring comprising a parallel arrangement of two spirals, an attachment of each of the two spirals being on the one hand to the arbor of the balance, and, on the other hand, to the balance bridge, wherein the distinct spring portions are not integrally formed.

2. The process for manufacturing an oscillator as claimed in claim 1, wherein the process comprises choosing the materials of the balance and of the spring portions prior to the choosing the frequency, the choosing the balance and spring portions, and the assembling.

3. The process for manufacturing an oscillator as claimed in claim 1, wherein the choosing the balance and spring portions comprises choosing a balance of inertia I and spring portions, each spring portion i of angular stiffnesses $C_i$, that respect the following equations:

$$f = \frac{1}{2\pi}\sqrt{\frac{\sum_i C_i}{I}}$$

and $$\frac{1}{f}\frac{df}{dT} = \frac{1}{2}\left(\frac{\sum_i C_i(CTE_i + 3\alpha_{s,i})}{\sum_i C_i} - 2\alpha_{bal}\right) = 0,$$

wherein $CTE_i$ is the thermal coefficient of the Young's modulus of the spring portion i, $\alpha_{s,i}$ is the thermal expansion coefficient of the spring portion i, $\alpha_{bal}$ is the thermal expansion coefficient of the balance, and T is temperature, wherein each spring portion i is a spiral or spiral segment, and i is a number from 1 to n, wherein n is the total number of spring portions.

4. The process for manufacturing an oscillator as claimed in claim 1, wherein the balance is made of CuBe2.

5. The process for manufacturing an oscillator as claimed in claim 1, wherein the choosing the balance and spring portions comprises selecting at least two spring portions having variations in their angular stiffness Ci of opposite signs as a function of temperature.

6. The process for manufacturing an oscillator as claimed in claim 1, wherein the spring portions are made of at least one material selected from the group consisting of single-crystal silicon whatever its crystal orientation, polysilicon, amorphous silicon, quartz, amorphous silicon oxide, doped silicon whatever the dopant type and concentration, alloys based on Fe—Ni possessing a positive CTE, and Nb—Zr—O alloys.

7. The process for manufacturing an oscillator as claimed in claim 1, wherein the spring portions have a shape of a turn segment, of one or more turns, of rectilinear blades, or of a combination of at least one turn segment and at least one turn, at least one turn segment and at least one rectilinear blade, at least one turn and at least one rectilinear blade, or at least one turn segment, at least one turn and at least one blade.

8. The process for manufacturing an oscillator as claimed in claim 1, wherein the choosing the balance and spring portions comprises:

choosing the inertia I for the balance; then choosing the balance, which inertia is equal or close to the chosen value I; then determining the angular stiffnesses Ci for each portion i of the spring so that $$f = \frac{1}{2\pi}\sqrt{\frac{\sum_i C_i}{I}}$$

and that the following equation also equals zero $$\frac{1}{f}\frac{df}{dT} = \frac{1}{2}\left(\frac{\sum_i C_i(CTE_i + 3\alpha_{s,i})}{\sum_i C_i} - 2\alpha_{bal}\right) = 0;$$

then choosing the spring portions whose respective angular stiffnesses are within +/−10% of the angular-stiffness values $C_i$, wherein $CTE_i$ is the thermal coefficient of the Young's modulus of the spring portion i, $\alpha_{s,i}$ is the thermal expansion coefficient of the spring portion i, $\alpha_{bal}$ is the thermal expansion coefficient of the balance, and T is temperature, wherein each spring portion i is a spiral or spiral segment, and i is a number from 1 to n, wherein n is the total number of spring portions.

9. The process for manufacturing an oscillator as claimed in claim 1, wherein the choosing the balance and spring portions comprises:

choosing the balance and measuring or estimating its the inertia I; then determining the angular stiffnesses $C_i$ for each portion i of the spring so that $$f = \frac{1}{2\pi}\sqrt{\frac{\sum_i C_i}{I}}$$

and that the following equation also equal zero $$\frac{1}{f}\frac{df}{dT} = \frac{1}{2}\left(\frac{\sum_i C_i(CTE_i + 3\alpha_{s,i})}{\sum_i C_i} - 2\alpha_{bal}\right) = 0;$$

then choosing the spring portions whose respective angular stiffnesses are within +/−10% of the angular-stiffness values $C_i$, wherein $CTE_i$ is the thermal coefficient of the Young's modulus of the spring portion i, $\alpha_{s,i}$ is the thermal expansion coefficient of the spring portion i, $\alpha_{ba1}$ is the thermal expansion coefficient of the balance, and T is temperature, wherein each spring portion i is a spiral or spiral segment, and i is a number from 1 to n, wherein n is the total number of spring portions.

10. A timepiece oscillator manufactured using a process as claimed in claim 1, wherein the oscillator comprises the balance and the return spring comprising the at least two spring portions that are arranged in parallel.

11. The oscillator as claimed in claim 10, wherein at least two of the spring portions have variations in their angular stiffness Ci of opposite signs as a function of temperature.

12. The oscillator as claimed in claim 10, wherein the oscillator comprises at least two spring portions made of materials selected from the group consisting of single-crystal silicon whatever its crystal orientation, polysilicon, amorphous silicon, quartz, amorphous silicon oxide, doped silicon whatever the dopant type and concentration, alloys based on Fe—Ni possessing a positive CTE, and Nb—Zr—O alloys.

13. The oscillator as claimed in claim 10, wherein the at least two distinct portions have the shape of spiral springs, of turns, of rectilinear blades, or of a combination of at least one spiral spring and at least one turn, at least one spiral spring and at least one rectilinear blade, at least one turn and at least one rectilinear blade, or at least one spiral spring, at least one turn and at least one rectilinear blade.

14. The oscillator as claimed in claim 10, wherein the oscillator comprises at least one distinct portion that has a cross section that varies over a length of the distinct portion.

15. The oscillator as claimed in claim 10, wherein the oscillator includes at least two distinct portions, which are arranged in parallel, comprising blades located in a same plane.

16. The oscillator as claimed in claim 10, wherein the oscillator comprises an angular return spring including at least two distinct portions that are arranged in parallel and wherein the oscillator comprises at least two attachments to the balance arbor and/or at least two attachments to the frame of the timepiece movement.

17. A timepiece wherein the timepiece is a watch and comprises an oscillator as claimed in claim 10.

18. The oscillator as claimed in claim 11, wherein the oscillator comprises at least two spring portions made of materials selected from the group consisting of single-crystal silicon whatever its crystal orientation, polysilicon, amorphous silicon, quartz, amorphous silicon oxide, doped silicon whatever the dopant type and concentration, alloys based on Fe—Ni possessing a positive CTE, and Nb—Zr—O alloys.

19. The oscillator as claimed in claim 11, wherein the at least two distinct portions have the shape of spiral springs, of turns, of rectilinear blades, or of a combination of at least one spiral spring and at least one turn, at least one spiral spring and at least one rectilinear blade, at least one turn and at least one rectilinear blade, or at least one spiral spring, at least one turn and at least one rectilinear blade.

20. The process for manufacturing an oscillator as claimed in claim 1, wherein one or more of the spring portions have a cross section that varies over a respective length thereof.

\* \* \* \* \*